US006967494B2

(12) United States Patent  
Kline

(10) Patent No.: US 6,967,494 B2
(45) Date of Patent: Nov. 22, 2005

(54) WAFER-INTERPOSER ASSEMBLY

(75) Inventor: Jerry D. Kline, Argyle, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 0 days.

(21) Appl. No.: 10/772,951

(22) Filed: Feb. 5, 2004

(65) Prior Publication Data

US 2004/0155328 A1    Aug. 12, 2004

Related U.S. Application Data

(62) Division of application No. 09/628,531, filed on Jul. 31, 2000, now Pat. No. 6,812,048.

(51) Int. Cl.$^7$ .......................... G01R 31/28; H01L 21/66
(52) U.S. Cl. .......................... 324/760; 324/765; 438/17
(58) Field of Search ................................ 324/754, 755, 324/757, 760, 765, 158.1; 438/17, 18; 257/48, 257/727, 734, 773, 777, 778

(56) References Cited

U.S. PATENT DOCUMENTS

| 3,939,558 | A | 2/1976 | Riley |
|---|---|---|---|
| 4,577,214 | A | 3/1986 | Schaper |
| 4,617,730 | A | 10/1986 | Geldermans et al. |
| 4,628,411 | A | 12/1986 | Balceres et al. |
| 4,688,151 | A | 8/1987 | Kraus et al. |
| 4,868,712 | A | 9/1989 | Woodman |
| 4,998,885 | A | 3/1991 | Beaman |
| 5,016,138 | A | 5/1991 | Woodman |
| 5,060,052 | A | 10/1991 | Casto et al. |
| 5,065,227 | A | 11/1991 | Frankeny |
| 5,086,558 | A | 2/1992 | Grube et al. |
| 5,123,850 | A | 6/1992 | Elder et al. |
| 5,132,613 | A | 7/1992 | Papae et al. |
| 5,148,265 | A | 9/1992 | Khandros et al. |
| 5,148,266 | A | 9/1992 | Khandros et al. |
| 5,222,014 | A | 6/1993 | Lin |
| 5,309,021 | A | 5/1994 | Shimamoto et al. |
| 5,327,325 | A | 7/1994 | Nicewarner, Jr. |
| 5,347,159 | A | 9/1994 | Khandros et al. |
| 5,347,162 | A | 9/1994 | Pasch |
| 5,371,654 | A | 12/1994 | Beaman et al. |
| 5,382,898 | A | 1/1995 | Subramanian |
| 5,384,691 | A | 1/1995 | Neugebauer |
| 5,394,303 | A | 2/1995 | Yamaji |
| 5,399,505 | A | 3/1995 | Dasse et al. |
| 5,399,898 | A | 3/1995 | Rostoker |
| 5,410,259 | A | 4/1995 | Fujihara et al. |
| 5,440,241 | A | 8/1995 | King et al. |
| 5,476,211 | A | 12/1995 | Khandros |
| 5,477,160 | A | 12/1995 | Love |
| 5,483,421 | A | 1/1996 | Gedney et al. |

(Continued)

Primary Examiner—Ernest F. Karlsen
(74) Attorney, Agent, or Firm—Lawrence R. Youst; Danamraj & Youst, P.C.

(57) ABSTRACT

A wafer-interposer assembly (10) includes a semiconductor wafer (12) having a plurality of semiconductor die (14) that have a plurality of first electrical contact pads (16). An interposer (22) is connected to the semiconductor wafer (12) such that a plurality of second electrical contact pads (26) associated with the interposer (22) are respectively connected to at least some of the first electrical contact pads (16) via conductive attachment elements (20). A communication interface (28) is integrally associated with the interposer (22) and electrically connected to at least some of the plurality of second electrical contact pads (26). The interposer (22) and the semiconductor wafer (12) are operable to be singulated into a plurality of chip assemblies.

24 Claims, 8 Drawing Sheets

U.S. PATENT DOCUMENTS

| | | | | |
|---|---|---|---|---|
| 5,489,804 | A | 2/1996 | Pasch | |
| 5,491,612 | A | 2/1996 | Nicewarner, Jr. | |
| 5,497,079 | A | 3/1996 | Yamada et al. | |
| 5,504,369 | A | 4/1996 | Dasse et al. | |
| 5,517,515 | A | 5/1996 | Spall et al. | |
| 5,518,964 | A | 5/1996 | DiStefano et al. | |
| 5,531,022 | A | 7/1996 | Beaman et al. | |
| 5,532,610 | A * | 7/1996 | Tsujide et al. | 324/757 |
| 5,532,612 | A | 7/1996 | Liang | |
| 5,544,017 | A | 8/1996 | Beilin et al. | |
| 5,548,223 | A | 8/1996 | Cole et al. | |
| 5,570,032 | A | 10/1996 | Atkins et al. | |
| 5,579,207 | A | 11/1996 | Hayden et al. | |
| 5,594,273 | A | 1/1997 | Dasse et al. | |
| 5,600,257 | A | 2/1997 | Leas et al. | |
| 5,600,541 | A | 2/1997 | Bone et al. | |
| 5,612,575 | A | 3/1997 | De Givry | |
| 5,615,089 | A | 3/1997 | Yoneda et al. | |
| 5,635,010 | A | 6/1997 | Pepe et al. | |
| 5,637,920 | A | 6/1997 | Loo | |
| 5,654,588 | A | 8/1997 | Dasse et al. | |
| 5,655,290 | A | 8/1997 | Moresco et al. | |
| 5,685,885 | A | 11/1997 | Khandros et al. | |
| 5,701,666 | A | 12/1997 | DeHaven et al. | |
| 5,710,071 | A | 1/1998 | Beddingfield et al. | |
| 5,714,800 | A | 2/1998 | Thompson | |
| 5,759,047 | A | 6/1998 | Brodsky et al. | |
| 5,764,071 | A | 6/1998 | Chan et al. | |
| 5,764,655 | A * | 6/1998 | Kirihata et al. | 714/733 |
| 5,789,807 | A | 8/1998 | Correale, Jr. | |
| 5,794,175 | A | 8/1998 | Conner | |
| 5,796,746 | A | 8/1998 | Farnworth et al. | |
| 5,798,652 | A | 8/1998 | Traci | |
| 5,800,184 | A | 9/1998 | Lopergolo et al. | |
| 5,802,713 | A | 9/1998 | Deamer | |
| 5,805,422 | A | 9/1998 | Otake et al. | |
| 5,806,181 | A | 9/1998 | Khandros et al. | |
| 5,832,601 | A | 11/1998 | Eldridge et al. | |
| 5,834,844 | A | 11/1998 | Akagawa et al. | |
| 5,834,946 | A | 11/1998 | Albrow et al. | |
| 5,838,060 | A | 11/1998 | Comer | |
| 5,838,072 | A | 11/1998 | Li et al. | |
| 5,844,803 | A | 12/1998 | Beffa | |
| 5,848,467 | A | 12/1998 | Khandros et al. | |
| 5,854,507 | A | 12/1998 | Miremadi et al. | |
| 5,878,486 | A | 3/1999 | Eldridge et al. | |
| 5,885,849 | A | 3/1999 | DiStefano et al. | |
| 5,892,287 | A | 4/1999 | Hoffman et al. | |
| 5,897,326 | A | 4/1999 | Eldridge et al. | |
| 5,900,738 | A | 5/1999 | Khandros et al. | |
| 5,905,382 | A | 5/1999 | Wood et al. | |
| 5,915,752 | A | 6/1999 | DiStefano et al. | |
| 5,927,193 | A | 7/1999 | Balz et al. | |
| 5,929,651 | A | 7/1999 | Leas et al. | |
| 5,936,847 | A | 8/1999 | Kazle | |
| 5,942,246 | A | 8/1999 | Mayhew et al. | |
| 5,943,213 | A | 8/1999 | Sasov | |
| 5,949,246 | A * | 9/1999 | Frankeny et al. | 324/765 |
| 5,950,070 | A | 9/1999 | Razon et al. | |
| 5,950,304 | A | 9/1999 | Khandros et al. | |
| 5,959,462 | A | 9/1999 | Lum | |
| 5,977,640 | A | 11/1999 | Bertin et al. | |
| 5,984,691 | A | 11/1999 | Brodsky et al. | |
| 6,002,178 | A | 12/1999 | Lin | |
| 6,013,944 | A | 1/2000 | Moriya et al. | |
| 6,018,462 | A | 1/2000 | Sakuyama | |
| 6,024,275 | A | 2/2000 | Taklar | |
| 6,032,356 | A | 3/2000 | Eldridge et al. | |
| 6,034,332 | A | 3/2000 | Moresco et al. | |
| 6,046,600 | A | 4/2000 | Whetsel | |
| 6,049,467 | A | 4/2000 | Tamarkin et al. | |
| 6,050,829 | A | 4/2000 | Eldridge et al. | |
| 6,053,395 | A | 4/2000 | Sasaki | |
| 6,064,213 | A | 5/2000 | Khandros et al. | |
| 6,069,026 | A | 5/2000 | Terrill et al. | |
| 6,080,264 | A | 6/2000 | Ball | |
| 6,080,494 | A | 6/2000 | Abbott | |
| 6,082,610 | A | 7/2000 | Shangguan et al. | |
| 6,083,773 | A | 7/2000 | Lake | |
| 6,098,278 | A | 8/2000 | Vindasius et al. | |
| 6,101,100 | A | 8/2000 | Londa | |
| 6,104,202 | A | 8/2000 | Slocum et al. | |
| 6,133,070 | A | 10/2000 | Yagi et al. | |
| 6,136,681 | A | 10/2000 | Razon et al. | |
| 6,137,299 | A | 10/2000 | Cadieux et al. | |
| 6,147,400 | A | 11/2000 | Faraci et al. | |
| 6,154,371 | A | 11/2000 | Oba et al. | |
| 6,161,205 | A * | 12/2000 | Tuttle | 714/724 |
| 6,190,940 | B1 | 2/2001 | DeFelice et al. | |
| 6,218,910 | B1 | 4/2001 | Miller | |
| 6,229,216 | B1 | 5/2001 | Ma et al. | |
| 6,242,279 | B1 | 6/2001 | Ho et al. | |
| 6,242,932 | B1 | 6/2001 | Hembree | |
| 6,246,247 | B1 | 6/2001 | Eldridge et al. | |
| 6,275,051 | B1 | 8/2001 | Bachelder et al. | |
| 6,281,046 | B1 | 8/2001 | Lam | |
| 6,297,553 | B1 | 10/2001 | Horiuchi et al. | |
| 6,303,992 | B1 | 10/2001 | Van Pham et al. | |
| 6,313,522 | B1 | 11/2001 | Akram et al. | |
| 6,319,829 | B1 | 11/2001 | Pasco et al. | |
| 6,331,782 | B1 * | 12/2001 | White et al. | 324/763 |
| 6,376,769 | B1 | 4/2002 | Chung | |
| 6,392,428 | B1 | 5/2002 | Kline et al. | |
| 6,432,744 | B1 | 8/2002 | Amador et al. | |
| 6,440,771 | B1 | 8/2002 | Pierce | |
| 6,483,043 | B1 | 11/2002 | Kline | |
| 6,483,330 | B1 | 11/2002 | Kline | |
| 6,524,885 | B2 | 2/2003 | Pierce | |
| 6,529,022 | B2 | 3/2003 | Pierce | |
| 6,537,831 | B1 | 3/2003 | Kline | |
| 6,627,998 | B1 | 9/2003 | Celetka et al. | |
| 6,673,653 | B2 | 1/2004 | Pierce | |
| 6,686,657 | B1 | 2/2004 | Kline | |
| 6,717,819 | B1 | 4/2004 | Chung | |
| 6,759,741 | B2 | 7/2004 | Kline | |
| 6,812,048 | B1 | 11/2004 | Kline | |
| 6,815,712 | B1 | 11/2004 | Kline | |
| 6,822,469 | B1 | 11/2004 | Kline | |
| 6,825,678 | B2 | 11/2004 | Kline | |
| 2002/0011663 | A1 | 1/2002 | Khandros et al. | |

* cited by examiner

WAFER-INTERPOSER ASSEMBLY

CROSS-REFERENCE TO RELATED APPLICATION

This is a divisional application of application Ser. No. 09/628,531, entitled "Method for Manufacturing a Wafer-Interposer Assembly," filed on Jul. 31, 2000 in the name of Jerry D. Kline, now U.S. Pat. No. 6,812,048 which is hereby incorporated by reference for all purposes.

TECHNICAL FIELD OF THE INVENTION

The present invention relates, in general, to wafer level processing of integrated circuit chips and, in particular, to a wafer-interposer assembly that provides for communication between test equipment and the integrated circuit chips.

BACKGROUND OF THE INVENTION

Semiconductor die have traditionally been electrically connected to a package by wire bonding techniques, in which wires are attached to pads of the die and to pads located in the cavity of the plastic or ceramic package. Wire bonding is still the interconnection strategy most often used in the semiconductor industry today. But the growing demand for products that are smaller, faster, less expensive, more reliable and have a reduced thermal profile has pushed wire bonding technology to its limits (and beyond) thereby creating barriers to sustained product improvement and growth.

The high-performance alternative to wire bonding techniques are flip chip techniques, in which solder balls or bumps are attached to the input/output (I/O) pads of the die at the wafer level. The bumped die is flipped over and attached to a substrate "face down," rather than "face up" as with wire bonding. Flip chips resolve many if not all of the problems introduced by wire bonding. First, flip chips have fewer electrical interconnects than wire bonding, which results in improved reliability and few manufacturing steps, thereby reducing production costs. Second, the face down mounting of a flip chip die on a substrate allows superior thermal management techniques to be deployed than those available in wire bonding. Third, flip chips allow I/O to be located essentially anywhere on the die, within the limits of substrate pitch technology and manufacturing equipment, instead of forcing I/O to the peripheral of the die as in wire bonding. This results in increased I/O density and system miniaturization.

Despite the advantages of the flip chip, wide spread commercial acceptance of the flip chip has been hindered by testing issues. To ensure proper performance, the die should be adequately tested before it is assembled into a product; otherwise, manufacturing yields at the module and system level can suffer and be unacceptably low. Under some circumstances, a defective die can force an entire subassembly to be scrapped. One attempt to address this testing issue has been to perform a wafer probe, followed by dicing the wafer and temporarily packaging each die into a test fixture of some sort. Performance testing is subsequently executed. Burn-in testing is often included in this process to eliminate any die having manufacturing process defects. Following the successful completion of these tests, the die are removed from the test fixture and either retailed as a Known Good Die ("KGD") product or used by the manufacturer in an end product, such as Multichip Module ("MCM"). The Multi-chip Module may constitute a subassembly in a larger system product. This Known Good Die process is inherently inefficient due to its complexity.

Accordingly, there is a need for a wafer-interposer assembly apparatus and method that is simple, allows testing at the wafer level before dicing, and eliminates the need for temporarily packaging the die in a carrier.

SUMMARY OF THE INVENTION

The present invention provides a wafer-interposer assembly apparatus and method that is simple, allows testing at the wafer level before dicing, and eliminates the need for temporarily packaging the die in a carrier. As a result, the number of manufacturing operations are reduced, thereby improving first pass yields. In addition, manufacturing time is decreased, thereby improving cycle times and avoiding additional costs.

More specifically, the present invention provides several possible test systems, apparatus and method of interfacing multiple semiconductor wafer to the testing equipment through the use of interposer assemblies, which enhances economies of scale. The interposer revolutionizes the semi-conductor fabrication process enabling testing and burn-in of all die at the wafer level. For example, the interposer eliminates the need to singulate, package, test, then unpackage each die individually to arrive at a Known Good Die product stage. Furthermore, the interposer may remain attached to the die following dicing, thereby providing the additional benefit of redistributing the die I/O pads to a standard Joint Electrical Dimensional Electronic Committee ("JDEC") interconnect pattern for Direct Chip Attachment ("DCA") applications.

The present invention provides a method for manufacturing a wafer-interposer assembly including the steps of providing a semiconductor wafer and an interposer. The semiconductor wafer including one or more semiconductor die, each semiconductor die having one or more first electrical contact pads. The interposer including one or more communication interfaces and a second electrical contact pad corresponding to each of the one or more first electrical contact pads on each semiconductor die of the semiconductor wafer, and at least one of the second electrical contact pads electrically connected to the one or more communications interfaces. The wafer-interposer assembly is formed by connecting each first electrical contact pad of the semiconductor wafer to the corresponding second electrical contact pad of the interposer with a conductive attachment element.

The present invention also provides a wafer-interposer assembly having an interposer connected to a semiconductor wafer. The semiconductor wafer includes one or more semiconductor die, each semiconductor die having one or more first electrical contact pads. The interposer includes one or more communication interfaces and a second electrical contact pad corresponding to each of the one or more first electrical contact pads on each semiconductor die of the semiconductor wafer, at least one of the second electrical contact pads electrically connected to the one or more communication interfaces, and each first electrical contact pad of the semiconductor wafer connected to the corresponding second electrical contact pad of the interposer with a conductive attachment element.

In addition, the present invention provides an interposer having a multi-layer sheet having a first surface and a second surface, a first pattern of electrical contact pads disposed on the first surface, one or more communication interfaces and a set of conductors. The first pattern of electrical contact pads correspond to a second pattern of electrical contact pads disposed on a surface of a semiconductor wafer. The one or more communication interfaces are attached to the multi-layer sheet. The set of conductors each of which connect at least one electrical contact pad are disposed on the first surface to the one more communication interfaces.

Moreover, the present invention provides wafer-interposer assemblies having various types of communication interfaces, such as integral edge connectors(s) with pins and/or sockets, integral bayonet connector(s) with pins and/or sockets, one or more connectors added to the wafer-interposer assembly, one or more soldered connections, one or more ribbon connectors, one or more RF connectors, one or more optical or infrared connectors, one or more transmit/receive antennas and one or more clamps or quick release devices.

Other features and advantages of the present invention shall be apparent to those of ordinary skill in the art upon reference to the following detailed description taken in conjunction with the accompanying drawings.

BRIEF DESCRIPTION OF THE DRAWINGS

The above and further advantages of the invention may be better understood by referring to the following description in conjunction with the accompanying drawings in which corresponding numerals in the different figures refer to corresponding parts in which.

DETAILED DESCRIPTION OF THE INVENTION

While the making and using of various embodiments of the present invention are discussed herein in terms of a wafer-interposer assembly testing apparatus and method, it should be appreciated that the present invention provides many applicable inventive concepts which can be embodied in a wide variety of specific contexts. The specific embodiments discussed herein are merely illustrative of specific ways to make and use the invention and does not limit the scope of the invention.

The present invention provides a wafer-interposer assembly apparatus and method that is simple, allows testing at the wafer level before dicing, eliminates the need for temporarily packaging the die in a carrier, and allows for simultaneous of near simultaneous testing multiple wafer-interposer assemblies. As a result, the number of manufacturing operations are reduced, thereby improving first pass yields. In addition, manufacturing time is decreased, thereby improving cycle times and avoiding additional costs.

Moreover, the interposer revolutionizes the semiconductor fabrication process enabling testing and burn-in of all die at the wafer level. For example, the interposer eliminates the need to singulate, package, test, then unpackage each die individually to arrive at a Known Good Die product stage. This results in a significant cost avoidance opportunity for wafer manufacturers. Furthermore, the interposer may remain attached to the die following dicing, thereby providing the additional benefit of redistributing the die I/O pads to a standard Joint Electrical Dimensional Electronic Committee ("JDEC") interconnect pattern for Direct Chip Attachment ("DCA") application.

Figure 1:
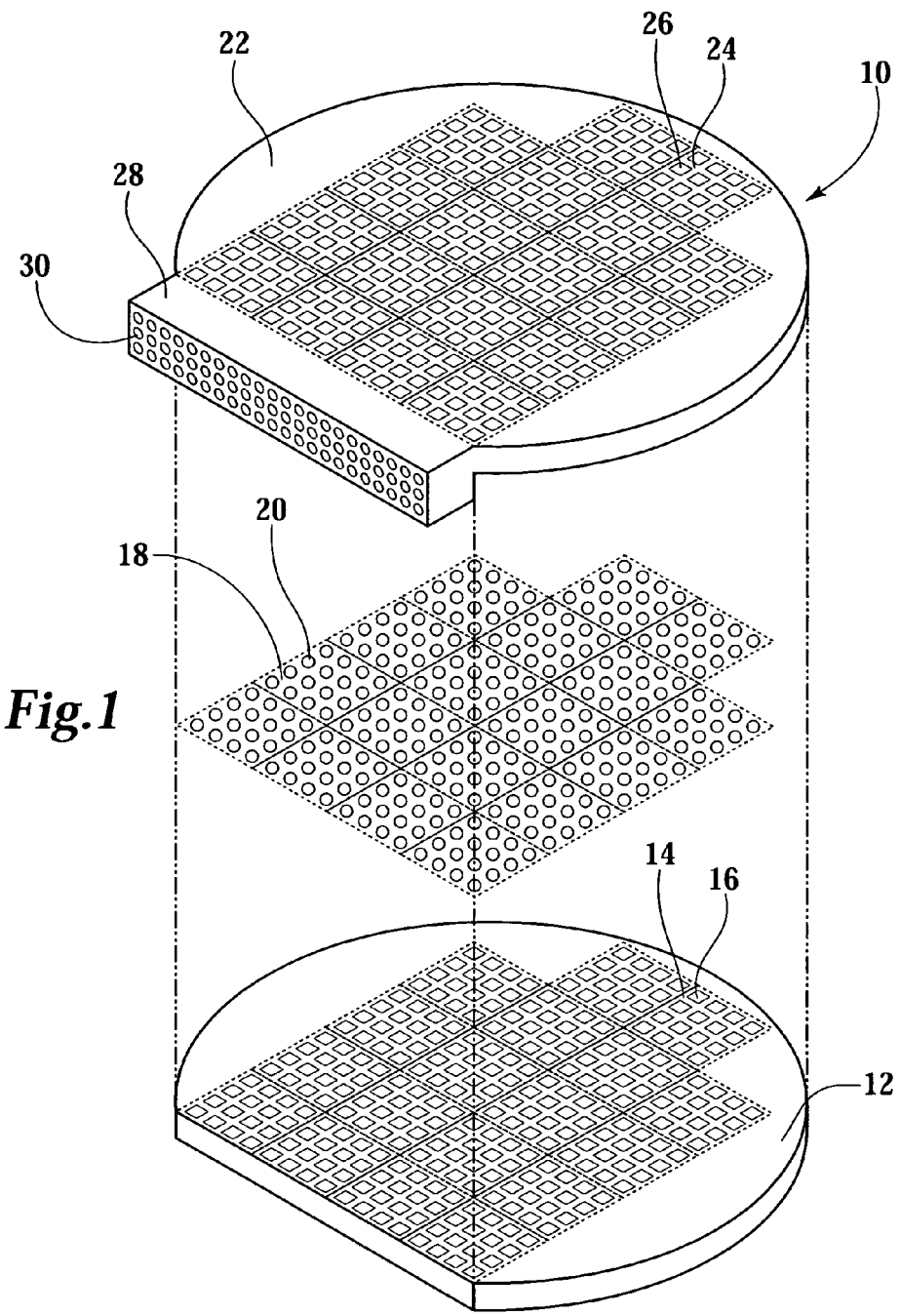
FIG. 1 is an exploded view of a wafer-interposer assembly in accordance with one embodiment of the present invention.

The general features of a wafer-interposer assembly, generally designated 10, in accordance with the present invention are shown in FIG. 1. A wafer-interposer assembly 10 comprises a wafer 12 having one or more chips 14 therein. Wafer 12 is depicted as having eighteen chips 14 for simplicity that are separated by dashed lines for clarity. Each chip 14 has one or more conductive pads 16 on its surface. For each chip 14 there is a corresponding array 18 of conductive attachment elements 20 one for each conductive pad 16. The conductive attachment elements 20 may be solder balls or bumps, screened solder paste, a set of conductive two part or heat cured epoxy, conductive thermoplastic balls or bumps or other electrical connection methods known in the art.

In one embodiment, the interposer 22 has an array 24 of conductive pads 26 on the surface facing away from the wafer 12. In another embodiment, the interposer does not have the array 24 of conductive pads 26. Instead, all conductors 32, 34, 36 and 38 (FIG. 2) are routed to the one or more communication interfaces, which are described in this embodiment as socket 30 in connector 28. In such a case, elements 24 and 26 in FIGS. 1 and 3 through 13 are not required. The interposer 22 also has an array of conductive pads (not shown) on the surface facing the wafer 12, one for each conductive pad 16 on the surface of the wafer 12. After assembly, the conductive attachment elements 20 electrically connect and mechanically bond the pads 16 of each chip 14 to the facing interposer pads (not shown).

The interposer 22 is preferably directly and permanently attached to the wafer 12, thereby eliminating the wafer-bumping step currently required for Flip chip and Flip chip/DCA applications. Alternately the interposer 22 may be created by application of materials on the wafer 12 itself, such as ink jet deposition of conductive epoxy, solder or polyimide. These materials can also be rolled on, sprayed on or applied through stereolithographic technologies. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the interposer 22.

Figure 2:
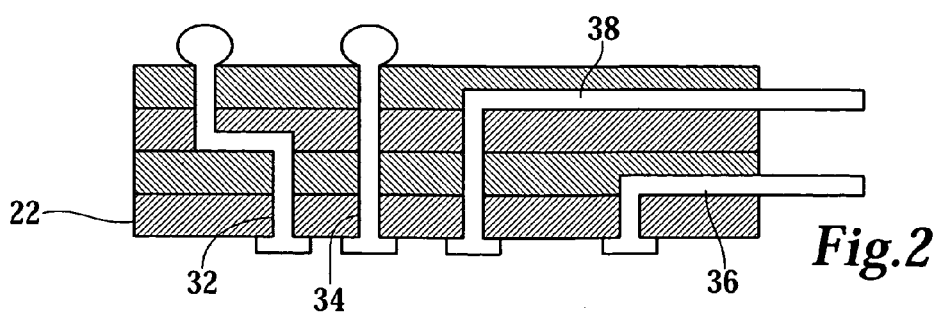
FIG. 2 is a cross-sectional view of an interposer in accordance with one embodiment of the present invention.

As best seen in FIG. 2, interposer 22 includes one or more layers having etched routing lines and vias therein which serve as electrical conductors. One set of conductors, depicted as conductors 32 and 34 pass through the interposer 22 to electrically connect the pads 16 on the chips 14 to the pads of a substrate to which the chip assembly will be attached as explained in more detail below. Conductors 32 and 34 are selected to have suitable conductivity and may be, for example, copper.

Testing conductors, depicted as conductors 36 and 38 pass through the interposer 22 connecting the pads 16 of the chips 14 to the testing sockets 30 in the testing connector 28, as best seen in FIG. 1. The testing conductors 36 and 38 may provide direct electrical connection between the testing sockets 30 and the pads 16, or may pass through a multiplexer or other intervening apparatus (not shown) incorporated into the interposer 22. As a result, the interposer 22 electrically connects all relevant nodes to standard test equipment without the need for probes.

Assembly of the wafer 12 and interposer 22 is accomplished through creating a set of permanent electrical and mechanical connections between the wafer 12 and interposer 22 using the conductive attachment elements 20. The conductive attachment elements 20 will typically be implemented as features on both the upper and lower surfaces of the interposer 22 but may alternatively be placed on the wafer 12. Likewise, the attachment elements 20 could be incorporated into a sheet or similar structure sandwiched between the wafer 12 and interposer 22 during assembly.

In order to test the chips 14 using the interposer 22, it will be necessary that a testing apparatus be able to connect to the full array of pads 16 on each chip 14 through the testing connector 28. For a wafer 12 having a substantial number of chips 14, each having a large number of pads 16, it may be desirable to connect the pads 16 to the testing sockets 30 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14. Such a design removes the necessity for a dedicated testing socket 30 for each chip pad 16, thereby reducing the complexity of the testing connector 28.

While FIG. 1 depicts an interposer 22 having a single, rectangular testing connector 28, it should be understood by those skilled in the art that interposer 22 could be attached to a testing apparatus in a variety of ways. For example, interposer 22 may have multiple testing connectors having various sizes, shapes and numbers of sockets. Likewise, interposer 22 may alternatively have testing connectors mounted on the top surface thereof instead of or in addition to the side mounted testing connectors or may use cables for connection to a testing apparatus.

It should also be noted that interposer 22 may include bypass capacitors to minimize ground bounce and to filter bias voltage. These capacitors may be standard surface mount devices or embedded within interposer 22. Additionally, interposer 22 may include inductors to provide additional filtering. Impedance matching networks and line drivers may also be incorporated into interposer 22 to ensure signal integrity and to accurately measure parameters such as signal rise time and bandwidth and to protect the semiconductor chips 14 in the event of test equipment failure.

The pads 26 on the upwardly facing surface of interposer 22 are depicted in FIG. 1 having the identical geometry as the pads 16 of the chips 14 of the wafer 12. The invention herein disclosed is by no means limited to this geometry. As each die design may have unique pad geometry, one of the advantages of the present invention is that pads 26 of interposer 22 may utilize a geometry that is different than that of the chips 14. Traditionally, chip designers were limited in chip layout in that all connections between the elements of the chip 14 and the outside world had to be made either through the peripheral edges of the chip (for wire bonding) or at least through a standard pin or pad layout defined by a standardization body, such as the Joint Electrical Dimensional Electronic Committee (JEDEC). The interconnection requirements, therefore, have traditionally driven the chip layout.

Through the use of the interposer 22, the layout of a chip 14 and its pads 16 can be defined according to the interaction of the functional elements of the chip 14 rather than according to the standardization requirements. The interposer 22 can be designed with a standardized layout of pads 26 on its upper surface and can electrically connect each chip pad 16 to the corresponding upper interposer pad 26 without an interposer pad 26 being directly above its corresponding chip pad 16. Not only does the interposer 22 of the present invention provide for standardized interconnection, it also provides for the use of standard test hardware, software, cabling and connectors compatible with existing industry infrastructure.

An additional advantage of interposer 22 of the present invention is that more than one interposer 22 can be designed for each wafer 12. A manufacturer can then, by substituting a different interposer 22, modify the layout of the output pads 16 to conform to a different layout or packaging standard. Alternatively, if the chip 14 and interposer 22 are designed for modularity, a single interposer design may be useful on more than one chip design. A specific interposer design will typically be necessary for each unique wafer design.

Figure 3:
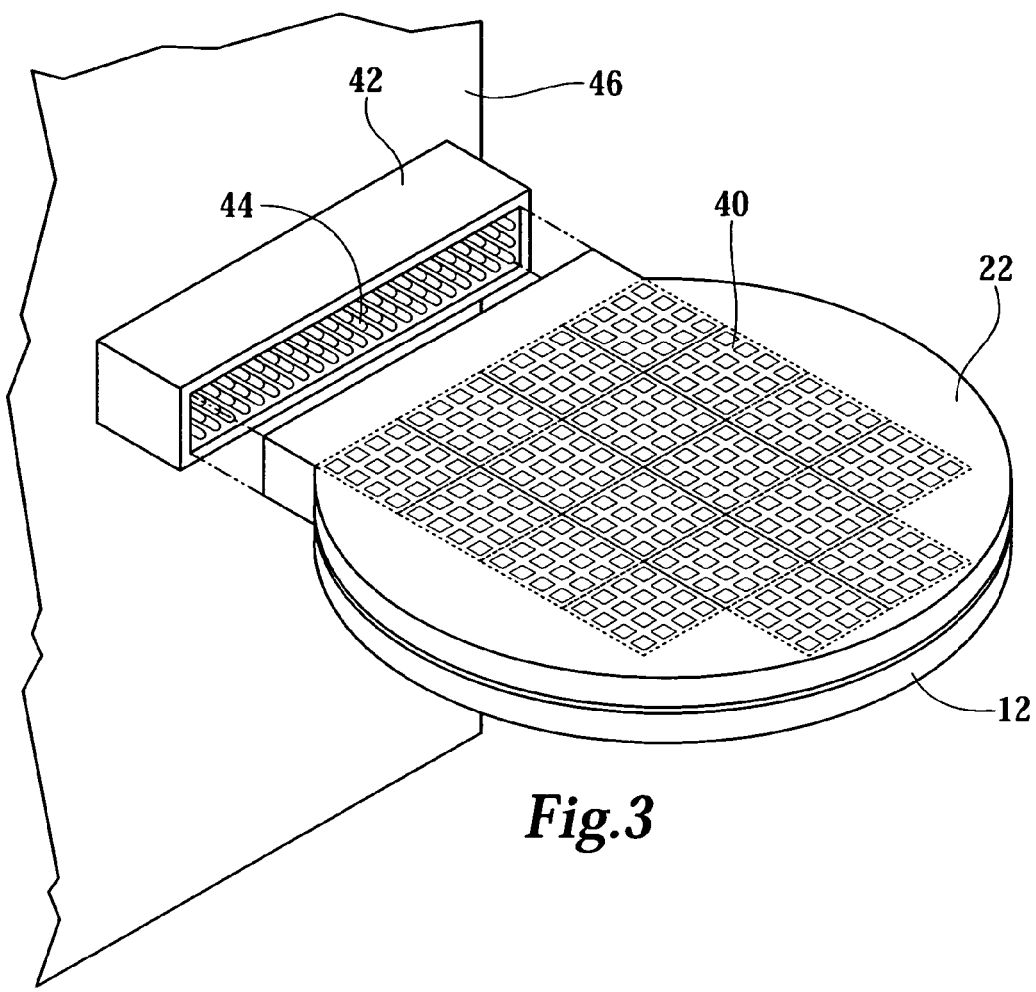
FIG. 3 is a perspective view of a wafer-interposer assembly being inserted into a testing apparatus in accordance with one embodiment of the present invention.
Figure 4:
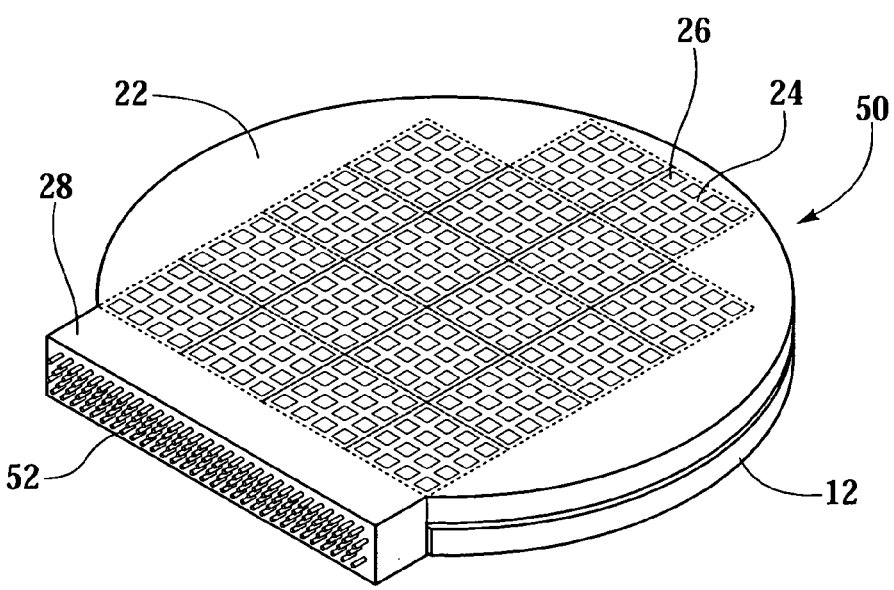
FIG. 4 is a perspective view of a wafer-interposer assembly having integral edge connector(s) with pins and/or sockets in accordance with one embodiment of the present invention.

Turning now to FIG. 3, a wafer 12 and interposer 22 are shown as an assembly 40 ready to be connected to a testing unit 46 in accordance with the present invention. The wafer-interposer assembly 40 interfaces to the testing unit 46 through a testing connector 42 comprising one or more testing contacts 44, shown here as pins. The testing contacts 44 in the testing connector 42 connect with the testing contacts 30 (FIG. 1) of the interposer 22. As noted above, the testing connector 42 need not incorporate a testing contact 44 for every chip pad. The contacts 44 may connect to the chips through a multiplexer or similar device (not shown). In addition, the testing connector 42 may be keyed to the shape of the wafer-interposer assembly 40 so that the wafer-interposer assembly 40 cannot be incorrectly inserted into the testing connector 42.

After electrical connection to the testing unit 46, the wafer-interposer assembly 40 can be run through a complete parametric test or whatever subset thereof is deemed necessary for that particular chip design. During the course of testing, each function of the chip may ideally be tested across a range of conditions, so as to simulate real world operation. The testing unit 46 may incorporate a heating and cooling apparatus for testing the chips across a range of temperatures. The testing unit 46 may also incorporate a device for vibrating or otherwise mechanically stressing the chips 14. During testing, non-conforming chips are identified by the testing unit 46 such that they may be discarded after singulation of the wafer-interposer assembly 40. Alternatively, where a manufacturer sells a variety of grades of a particular model of chip, individual chips can be graded according to various performance criteria, such as maximum clock speed or thermal stability, for later classification and sorting. Such parametric data and attribute data are stored by the testing unit 46 and may be displayed or printed for the operator. Other information such as operator identification code, date, lot number and the like will be stored.

While FIG. 3 depicts a single wafer-interposer assembly 40 being tested, multiple wafer-interposer assemblies may be tested in a rack and/or bank configuration. It should be understood by those skilled in the art that groups of wafer-interposer assemblies could be tested using other topologies. In such a testing scenarios, additional multiplexers, capacitor, impedance matching networks and related components would typically be used.

FIGS. 4 through 13 will now depict various embodiments of one or more communication interfaces that may be used for testing and/or operational use of the semiconductor wafer and/or die. Now referring to FIG. 4, a wafer-interposer assembly 50 having integral edge connector(s) 52 with pins and/or sockets in accordance with one embodiment of the present invention is shown. As previously described, the wafer-interposer assembly 50 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. For a wafer 12 having a substantial number of chips 14 (FIG. 1), each having a large number of pads 16 (FIG. 1), it may be desirable to connect the pads 16 (FIG. 1) to the integral edge connector(s) 52, which may include pins and/or sockets, through one or more multiplexers (not shown). The multiplexer could be built into the interposer 22 as a standard surface mount device or could be separate component or set of components. The multiplexer could be powered by the test apparatus or from the bias voltage powering the semiconductor chips 14 (FIG. 1). Such a design removes the necessity for a dedicated integral edge connector(s) 52 for each chip pad 16 (FIG. 1), thereby reducing the complexity of the testing connector 28.

Figure 5:
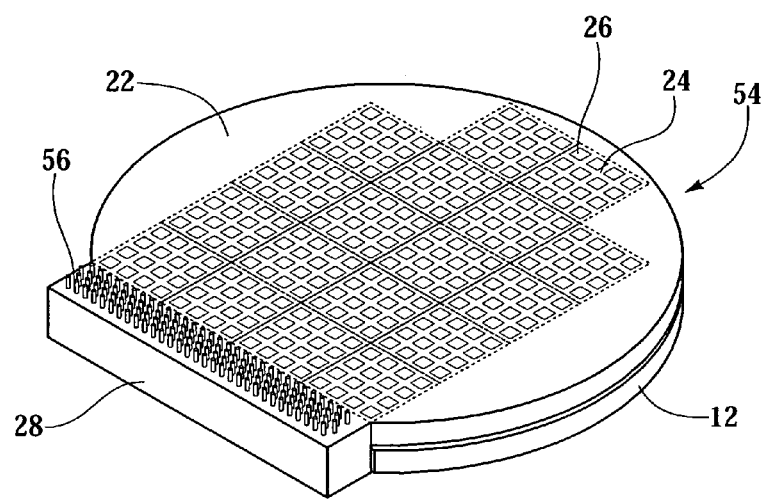
FIG. 5 is a perspective view of a wafer-interposer assembly having integral bayonet connector(s) with pins and/or sockets in accordance with one embodiment of the present invention.

Referring to FIG. 5, a wafer-interposer assembly 54 having integral bayonet connector(s) 56 with pins and/or sockets in accordance with one embodiment of the present invention is shown. The integral bayonet connector(s) 56 may extend vertically upward as shown or vertically downward (not shown). As previously described, the wafer-interposer assembly 54 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. For a wafer 12 having a substantial number of chips 14 (FIG. 1), each having a large number of pads 16 (FIG. 1), it may be desirable to connect the pads 16 (FIG. 1) to the integral bayonet connector(s) 56, which may include pins and/or sockets, through one or more multiplexers (not shown). The multiplexer could be built into the interposer 22 as a standard surface mount device or could be separate component or set of components. The multiplexer could be powered by the test apparatus or from the bias voltage powering the semiconductor chips 14 (FIG. 1). Such a design removes the necessity for a dedicated integral bayonet connectors(s) 56 for each chip pad 16 (FIG. 1), thereby reducing the complexity of the testing connector 28.

Figure 6:
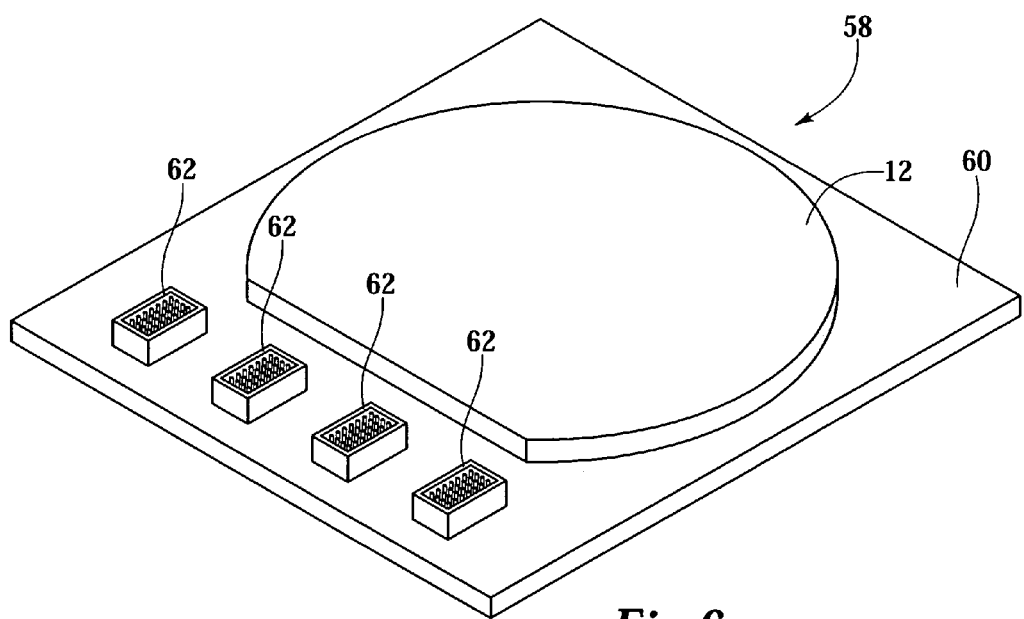
FIG. 6 is a perspective view of a wafer-interposer assembly having one or more connectors added to the wafer-interposer assembly in accordance with one embodiment of the present invention.

Now referring to FIG. 6, a wafer-interposer assembly 58 having one or more connectors 62 added to the wafer-interposer assembly 58 in accordance with one embodiment of the present invention is shown. As previously described, the wafer-interposer assembly 58 includes an interposer 60 attached to a wafer 12. In order to test the chips 14 (FIG. 1) using the interposer 60, it will be necessary that a testing apparatus be able to connect to the full array of pads 16 (FIG. 1) on each chip 14 (FIG. 1) through the one or more connectors 62. For a wafer 12 having a substantial number of chips 14 (FIG. 1), each having a large number of pads 16 (FIG. 1), it may be desirable to connect the pads 16 (FIG. 1) to the one or more connectors 62 through one or more multiplexers (not shown). The multiplexer could be built into the interposer 60 as a standard surface mount device or could be a separate component or set of components. The multiplexer could be powered by the test apparatus or from the bias voltage powering the semiconductor chips 14 (FIG. 1). Such a design removes the necessity for a dedicated pins or sockets within the one or more connectors 62 for each chip pad 16 (FIG. 1), thereby reducing the complexity of the one or more connectors 62.

Figure 7:
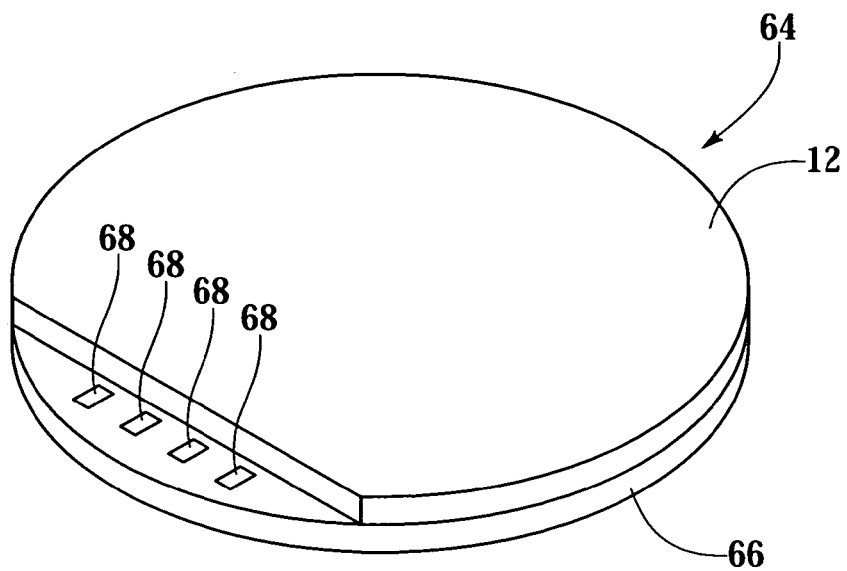
FIG. 7 is a perspective view of a wafer-interposer assembly having one or more connectors added to the wafer-interposer assembly in accordance with one embodiment of the present invention.

Referring now to FIG. 7, a wafer-interposer assembly 64 having one or more connectors 68 added to the wafer-interposer assembly 64 in accordance with one embodiment of the present invention is shown. As previously described, the wafer-interposer assembly 64 includes an interposer 66 attached to wafer 12. In order to test the chips 14 (FIG. 1) using the interposer 66, it will be necessary that a testing apparatus be able to connect to the full array of pads 16 (FIG. 1) on each chip 14 (FIG. 1) through the one or more connectors 68. For a wafer 12 having a substantial number of chips 14 (FIG. 1), each having a large number of pads 16 (FIG. 1), it may be desirable to connect the pads 16 (FIG. 1) to the one or more connectors 68 through one or more multiplexers (not shown). The multiplexer could be built into the interposer 66 as a standard Surface mount device or could be a separate component or set of components. The multiplexer could be powered by the test apparatus or from the bias voltage powering the semiconductor chips 14 (FIG. 1). Such a design removes the necessity for a dedicated pins or sockets within the one or more connectors 68 for each chip pad 16 (FIG. 1), thereby reducing the complexity of the one or more connectors 68.

Figure 8:
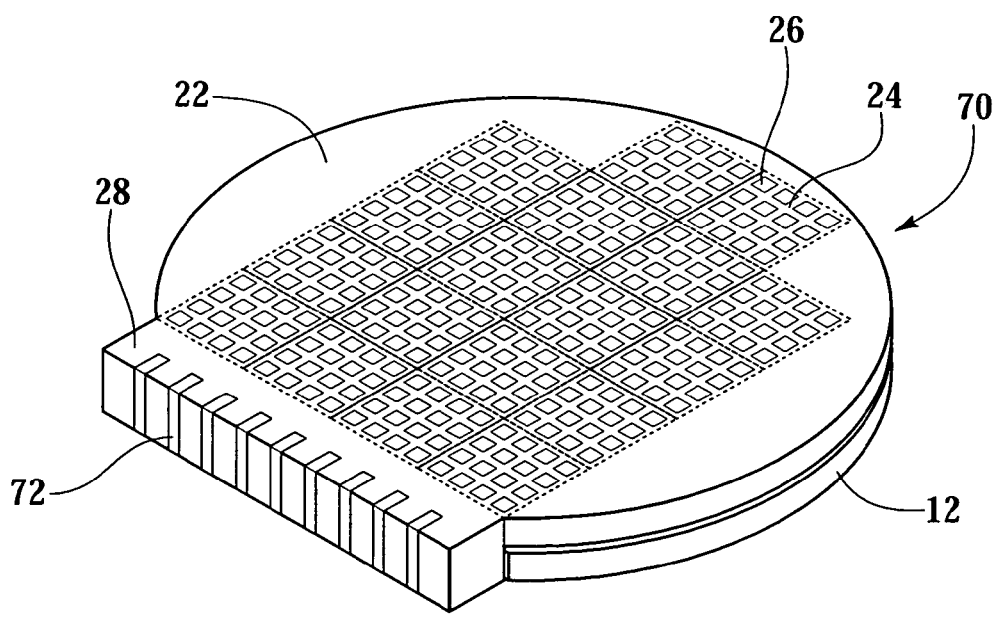
FIG. 8 is a perspective view of a wafer-interposer assembly having one or more soldered connections in accordance with one embodiment of the present invention.

Now referring to FIG. 8, a wafer-interposer assembly 70 having one or more soldered connections 72 in accordance with one embodiment of the present invention is shown. As previously described, the wafer-interposer assembly 70 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. For a wafer 12 having a substantial number of chips 14 (FIG. 1), each having a large number of pads 16 (FIG. 1), it may be desirable to connect the pads 16 (FIG. 1) to the one or more soldered connections 72 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for a soldered connection 72 for each chip pad 16 (FIG. 1), thereby reducing the complexity of the testing connector 28.

Figure 9:
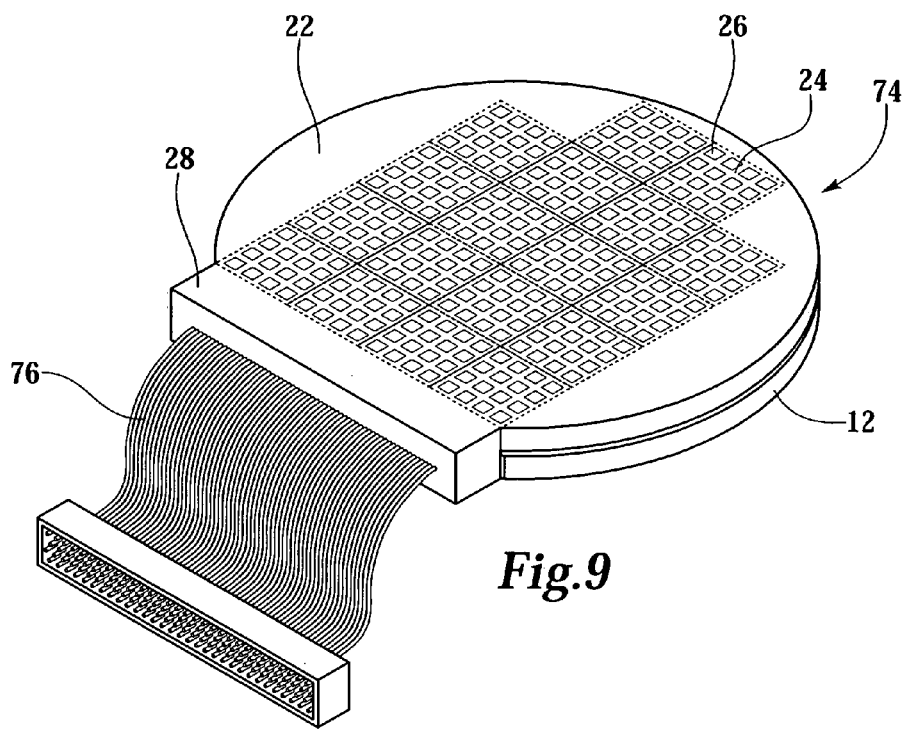
FIG. 9 is a perspective view of a wafer-interposer assembly having one or more ribbon connectors in accordance with one embodiment of the present invention.

Referring now to FIG. 9, a wafer-interposer assembly 74 having one or more ribbon connectors 76 in accordance with one embodiment of the present invention is shown. Alternatively, the ribbon connectors 76 may extend from other surfaces of the wafer-interposer assembly 74. As previously described, the wafer-interposer assembly 74 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. For a wafer 12 having a substantial number of chips 14 (FIG. 1), each having a large number of pads 16 (FIG. 1), it may be desirable to connect the pads 16 (FIG. 1) to the one or more ribbon connectors 76 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for a lead within the ribbon connector 76 for each chip pad 16 (FIG. 1), thereby reducing the complexity of the testing connector 28.

Figure 10:
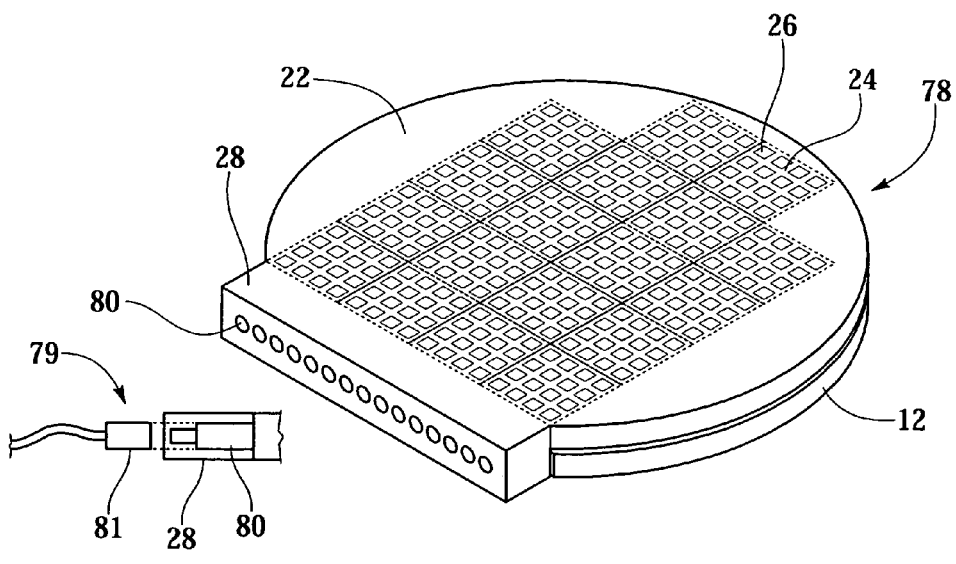
FIG. 10 is a perspective view of a wafer-interposer assembly having one or more RF connectors in accordance with one embodiment of the present invention.

Now referring to FIG. 10, a wafer-interposer assembly 78 having one or more RF connectors 80 in accordance with one embodiment of the present invention is shown. As previously described, the wafer-interposer assembly 78 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. A cut away drawing of the testing connector 28 is depicted and labeled as 79, and shows a detail of a RF connector 80 as it can be connected to a testing cable connector 81. For a wafer 12 having a substantial number of chips 14 (FIG. 1), each having a large number of pads 16 (FIG. 1), it may be desirable to connect the pads 16 (FIG. 1) to the one or more RF connectors 80 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for an RF connector 80 for each chip pad 16 (FIG. 1), thereby reducing the complexity of the testing connector 28.

Figure 11:
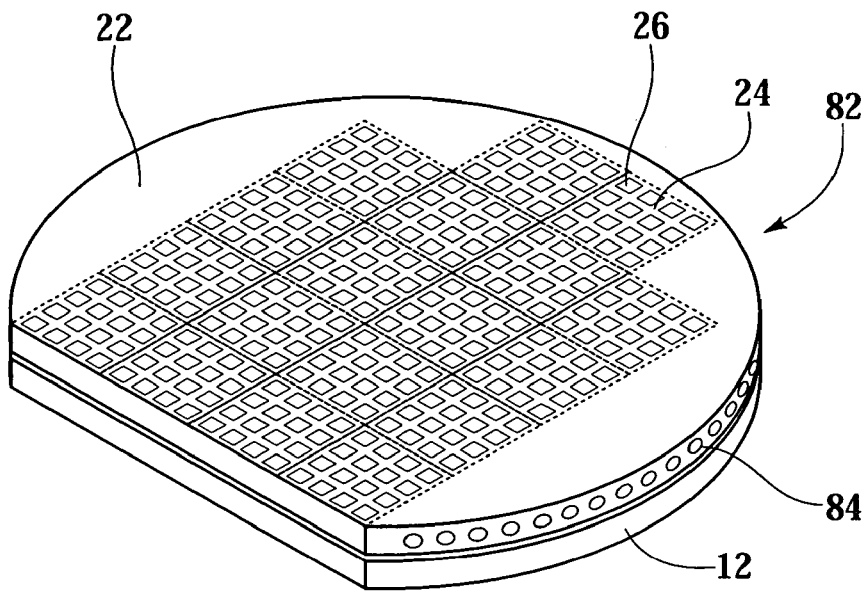
FIG. 11 is a perspective view of a wafer-interposer assembly having one or more optical or infrared connectors in accordance with one embodiment of the present invention.

Referring now to FIG. 11, a wafer-interposer assembly 82 having one or more optical or infrared connectors 84 in accordance with one embodiment of the present invention is shown. As previously described, the wafer-interposer assembly 82 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) via the one or more optical or infrared connectors 84. For a wafer 12 having a substantial number of chips 14 (FIG. 1), each having a large number of pads 16 (FIG. 1), it may be desirable to connect the pads 16 (FIG. 1) to the one or more optical or infrared connectors 84 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for an optical or infrared connector 84 for each chip pad 16 (FIG. 1), thereby reducing the complexity of the interposer 22. Alternatively, the optical or infrared connectors 84 can be located in connector assembly 28.

Figure 12:
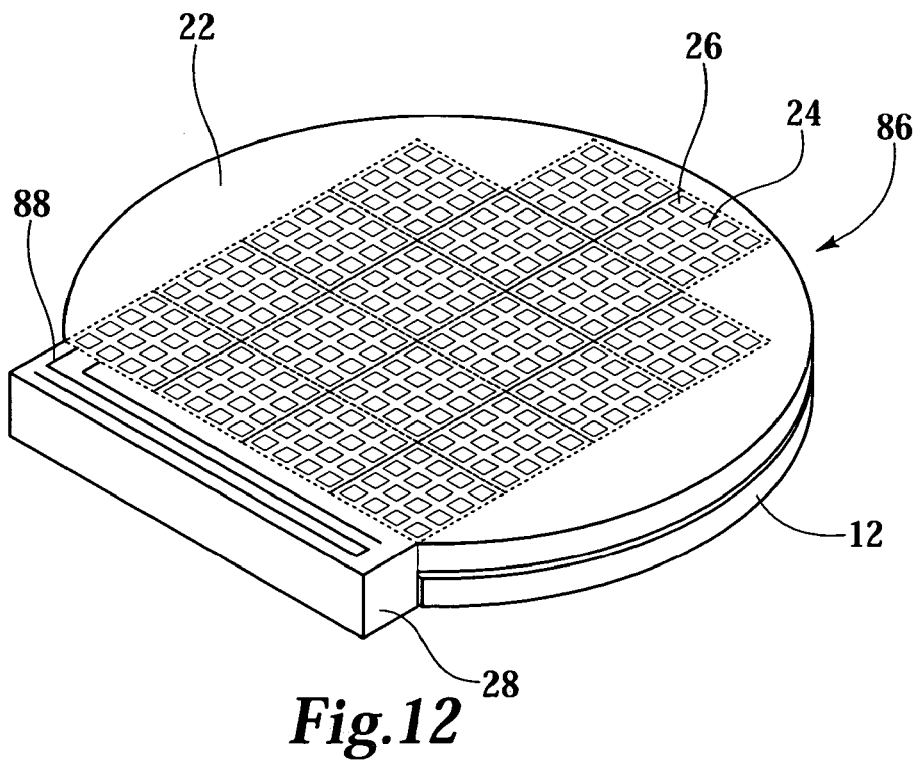
FIG. 12 is a perspective view of a wafer-interposer assembly having one or more transmit/receive antennas in accordance with one embodiment of the present invention.

Now referring to FIG. 12, a wafer-interposer assembly 86 having one or more transmit/receive antennas 88 in accordance with one embodiment of the present invention is shown. As previously described, the wafer-interposer assembly 86 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the testing connector 28. For a wafer 12 having a substantial number of chips 14 (FIG. 1), each having a large number of pads 16 (FIG. 1), it may be desirable to connect the pads 16 (FIG. 1) to the transmit/receive antennas 88 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for transmit/receive antennas 88 for each chip pad 16 (FIG. 1), thereby reducing the complexity of the transmit/receive antennas 88.

Figure 13:
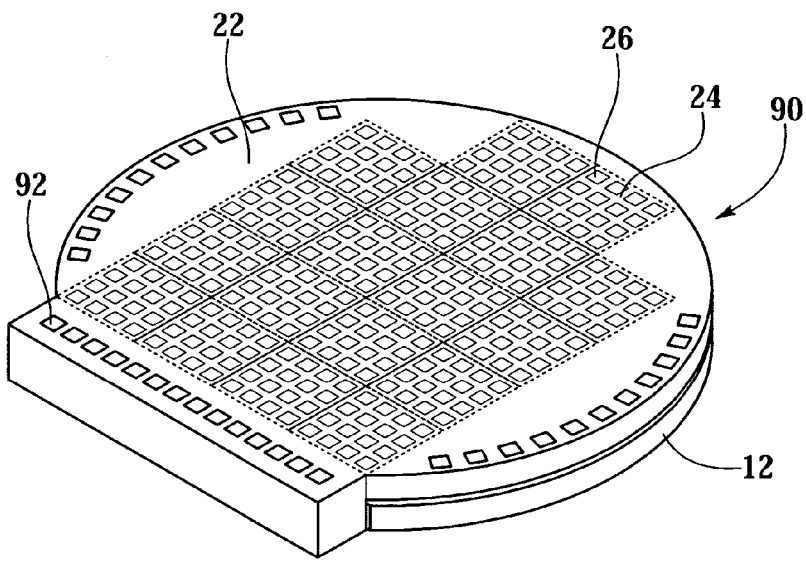
FIG. 13 is a perspective view of a wafer-interposer assembly having one or more clamps or quick release devices in accordance with one embodiment of the present invention.

Referring now to FIG. 13, a wafer-interposer assembly 90 having one or more clamps or quick release devices 92 in accordance with one embodiment of the present invention is shown. As previously described, the wafer-interposer assembly 90 includes an interposer 22 attached to a wafer 12. In addition, the interposer has an array 24 of conductive pads 26 on the surface facing away from the wafer 12. In order to test the chips 14 (FIG. 1) using the interposer 22, it will be necessary that a testing apparatus be able to connect to the full array of pads 16 (FIG. 1) on each chip 14 (FIG. 1) through the one or more clamps or quick release devices 92. For a wafer 12 having a substantial number of chips 14 (FIG. 1), each having a large number of pads 16 (FIG. 1), it may be desirable to connect the pads 16 (FIG. 1) to the one or more clamps or quick release devices 92 through one or more multiplexers (not shown). The multiplexer could be built into the interposer 22 as a standard surface mount device or could be a separate component or set of components. The multiplexer could be powered by the test apparatus or from the bias voltage powering the semiconductor chips 14 (FIG. 1). Such a design removes the necessity for a clamp or quick release device 92 for each chip pad 16 (FIG. 1), thereby reducing the complexity of the interposer 22.

Figure 14:
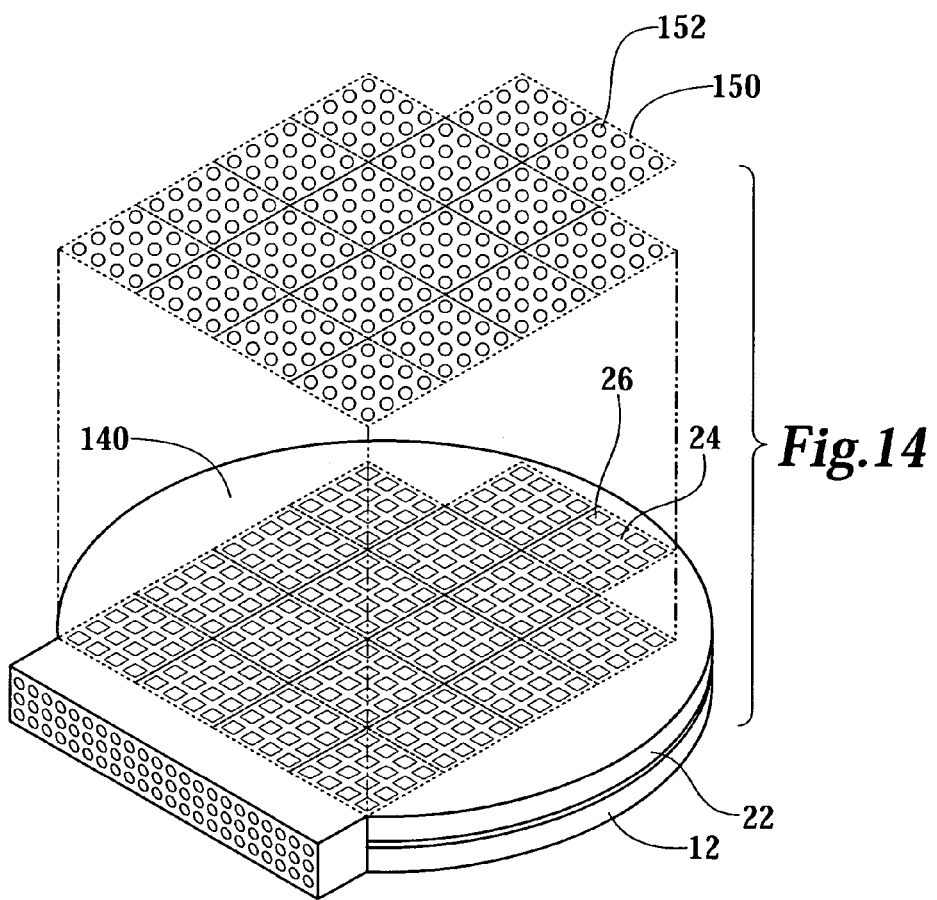
FIG. 14 is an exploded view of a wafer-interposer assembly having an array of conductive attachment elements disposed on the upper surface thereof in accordance with the present invention.

Turning now to FIG. 14, a wafer-interposer assembly 140 is shown having an array 24 of conductive pads 26 on its upper surface. The array 150 of conductive attachment elements 152 may typically be attached to interposer 22 prior to its attachment to wafer 12. Alternatively, the conductive attachment elements 152 may not be attached to interposer 22 at all or may be attached to the interposer 22 following testing of chips 14 (FIG. 1) of wafer 12. The conductive attachment elements 152 may be of the types discussed above with reference to FIG. 1.

Figure 15:
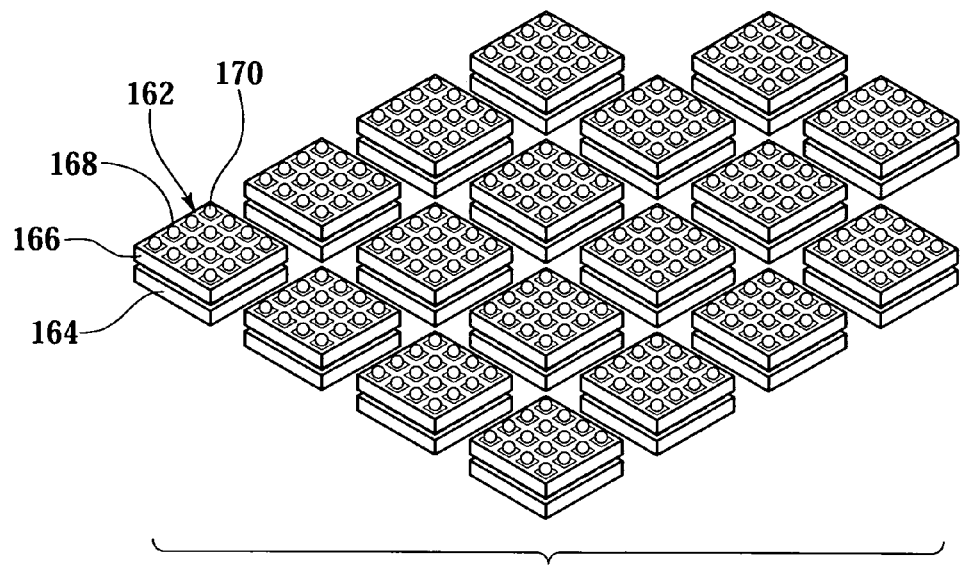
FIG. 15 is an isometric view of multiple chip assemblies after singulation of the wafer-interposer assembly in accordance with the present invention.

FIG. 15 shows an array of chip assemblies 162, after singulation of the wafer-interposer assembly 140 (FIG. 14). Each chip assembly 162 comprises a chip 164, an interposer 166 and a plurality of conductive attachment elements 170 deposited on the conductive pads 168 on the exposed surface of the interposer 166. The chip assemblies 162 will be separated into conforming and non-conforming groups or sorted by performance level according to the results of the wafer level testing described in accordance with FIG. 3. The wafer-interposer assembly 140 (FIG. 14) can be singulated into groups of chip assemblies 162 instead of individual die.

Figure 16:
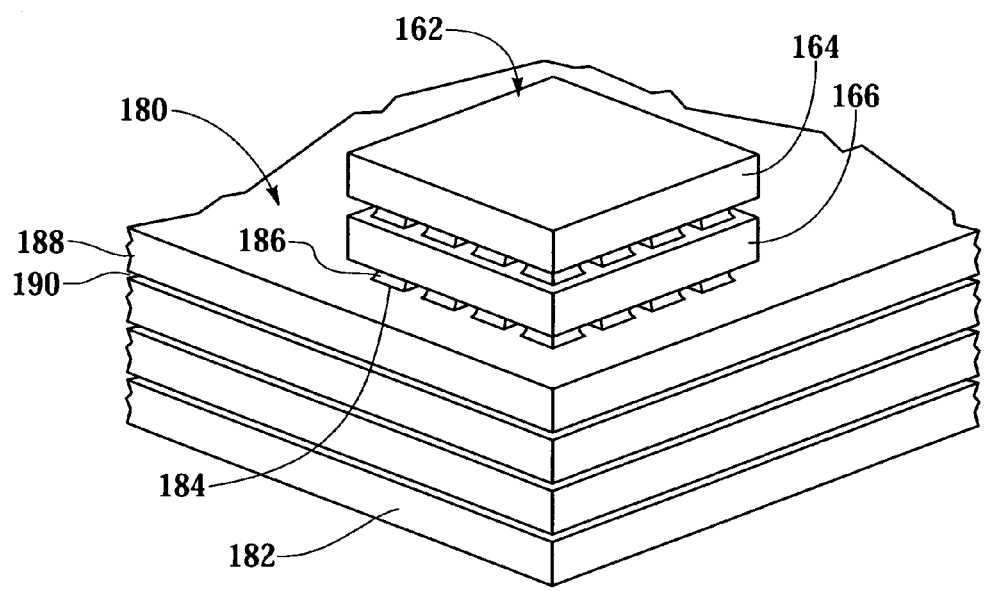
FIG. 16 is an isometric view of a chip assembly in place on a substrate in accordance with the present invention.

FIG. 16 shows an assembly 180 comprising a chip assembly 162 mounted on a substrate 182 having a plurality of conductive layers 190 and dielectric layers 188. The chip assembly 162 is electrically and mechanically attached to pads 184 on the surface of the substrate 182 through conductive attachment elements 186. The chip assembly 162 communicates with other electronic devices (not shown) through the conductive layers 190 of the substrate 182. Assembled as shown, the interposer 166 provide electrical connection between chip 164 the substrate 182.

In certain embodiments, the substrate 182 may represent a traditional FR4 circuit board. In other embodiments, the substrate 182 may be composed of a higher grade material suitable for use in multichip modules requiring finer conductor pitch. In the latter embodiment, the chip assembly 162 would generally be one of several such assemblies mounted on a small substrate in close proximity. This invention is well suited for implementation in these assemblies. It can be seen in FIG. 16 that the chip assembly 162 occupies an area of substrate 182 only slightly larger than the surface of the chip 164. This is in contrast to traditional semiconductor assemblies, in which the area consumed by each chip package is much greater than the area of the chip itself.

While specific alternatives to steps of the invention have been described herein, additional alternatives not specifically disclosed but known in the art are intended to fall within the scope of the invention. For example, any combination and orientation of the connectors illustrated and described above may be used within the scope of the present invention. Thus, it is understood that other applications of the present invention will be apparent to those skilled in the art upon the reading of the described embodiment and a consideration of the appended claims and drawings.

What is claimed is:

1. A wafer-interposer assembly comprising:
   a semiconductor wafer including a plurality of semiconductor die, each semiconductor die having a plurality of first electrical contact pads;
   le;.5qan interposer electrically connected and mechanically secured to the semiconductor wafer, the interposer including a plurality of second electrical contact pads respectively electrically connected and mechanically secured to at least some of the first electrical contact pads via soldered connections such that the interposer and the semiconductor wafer are operable to be singulated into a plurality of chip assemblies, each chip assembly comprising a semiconductor die and a portion of the interposer electrically connected and mechanically secured to one another via soldered connections; and
   a communication interface integrally associated with the interposer and electrically connected to at least some of the second electrical contact pads.

2. The water-interposer assembly as recited in claim 1 wherein the communication interface further comprises an integral edge connector with pins.

3. The water-interposer assembly as recited in claim 1 wherein the communication interface further comprises an integral bayonet connector with pins.

4. The wafer-interposer assembly as recited in claim 1 wherein the communication interface further comprises a connector added to the wafer-interposer assembly.

5. The wafer-interposer assembly as recited in claim 1 wherein the communication interface further comprises soldered connections.

6. The wafer-interposer assembly as recited in claim 1 wherein the communication interface further comprises a ribbon connector.

7. The wafer-interposer assembly as recited in claim 1 wherein the communication interface further comprises an RF connector.

8. The wafer-interposer assembly as recited in claim 1 wherein the communication interface further comprises an optical connector.

9. The wafer-interposer assembly as recited in claim 1 wherein the communication interface further comprises a transmit/receive antenna.

10. The wafer-interposer assembly as recited in claim 1 wherein the communication interface further comprises a quick release device.

11. The wafer-interposer assembly as recited in claim 1 wherein the communication interface is operably coupled to a testing apparatus that tests at least some of the semiconductor die prior to the singulation of the interposer and the semiconductor wafer.

12. The wafer-interposer assembly as recited in claim 1 wherein the communication interface is operably coupled to a testing apparatus that burn-in tests at least some of the semiconductor die prior to the singulation of the interposer and the semiconductor wafer.

13. A wafer-interposer assembly comprising:
   a semiconductor wafer including a plurality of semiconductor die having a pattern of first electrical contact pads disposed thereon;
   an interposer electrically connected and mechanically secured to the semiconductor wafer, the interposer having a first surface with a pattern of second electrical contact pads disposed thereon, at least some of which correspond to and are electrically connected and mechanically secured to at least some of the first electrical contact pads via soldered connections, the interposer also having a second surface having a pattern of third electrical contact pads that are electrically connected to at least some of the second electrical contact pads, such that the interposer and the semiconductor wafer are operable to be singulated into a plurality of chip assemblies, each including a semiconductor die and a portion of the interposer that remain electrically connected and mechanically secured to one another via soldered connections; and a communication interface integrally associated with the interposer and electrically connected to at least some of the second electrical contact pads.

14. The wafer-interposer assembly as recited in claim 13 wherein the communication interface further comprises an integral edge connector with pins.

15. The wafer-interposer assembly as recited in claim 13 wherein the communication interface further comprises an integral bayonet connector with pins.

16. The wafer-interposer assembly as recited in claim 13 wherein the communication interface further comprises a connector added to the wafer-interposer assembly.

17. The wafer-interposer assembly as recited in claim 13 wherein the communication interface further comprises soldered connections.

18. The wafer-interposer assembly as recited in claim 13 wherein the communication interface further comprises a ribbon connector.

19. The wafer-interposer assembly as recited in claim 13 wherein the communication interface further comprises an RF connector.

20. The wafer-interposer assembly as recited in claim 13 wherein the communication interface further comprises an optical connector.

21. The wafer-interposer assembly as recited in claim 13 wherein the communication interface further comprises a transmit/receive antenna.

22. The wafer-interposer assembly as recited in claim 13 wherein the communication interface further comprises a quick release device.

23. The wafer-interposer assembly as recited in claim 13 wherein the communication interface is operably coupled to a testing apparatus that tests at least some of the semiconductor die prior to the singulation of the interposer and the semiconductor wafer.

24. The water-interposer assembly as recited in claim 13 wherein the communication interface is operably coupled to a testing apparatus that burn-in tests at least some of the semiconductor die prior to the singulation of the interposer and the semiconductor wafer.

* * * * *

UNITED STATES PATENT AND TRADEMARK OFFICE
CERTIFICATE OF CORRECTION

PATENT NO. : 6,967,494 B2
DATED : November 22, 2005
INVENTOR(S) : Jerry D. Kline It is certified that error appears in the above-identified patent and that said Letters Patent is hereby corrected as shown below:

Column 12,
Line 6, "le; 5qan Interposer" should read -- an interposer --.

Signed and Sealed this

Twenty-fourth Day of January, 2006

JON W. DUDAS
*Director of the United States Patent and Trademark Office*